United States Patent
Chavva et al.

(10) Patent No.: US 11,551,904 B2
(45) Date of Patent: Jan. 10, 2023

(54) SYSTEM AND TECHNIQUE FOR PROFILE MODULATION USING HIGH TILT ANGLES

(71) Applicant: Applied Materials, Inc., Santa Clara, CA (US)

(72) Inventors: Venkataramana R. Chavva, Gloucester, MA (US); KyuHa Shim, Gloucester, MA (US); Hans Gossmann, Gloucester, MA (US); Edwin Arevalo, Gloucester, MA (US); Scott Falk, Gloucester, MA (US); Rajesh Prasad, Gloucester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 339 days.

(21) Appl. No.: 17/015,545

(22) Filed: Sep. 9, 2020

(65) Prior Publication Data
US 2022/0076915 A1 Mar. 10, 2022

(51) Int. Cl.
| | |
|---|---|
| *H01J 37/20* | (2006.01) |
| *H01L 21/265* | (2006.01) |
| *H01J 37/317* | (2006.01) |
| *H01L 21/225* | (2006.01) |
| *H01J 37/05* | (2006.01) |
| *H01J 37/08* | (2006.01) |

(52) U.S. Cl.
CPC .............. *H01J 37/20* (2013.01); *H01J 37/05* (2013.01); *H01J 37/08* (2013.01); *H01J 37/3171* (2013.01); *H01L 21/2253* (2013.01); *H01L 21/26513* (2013.01); *H01L 21/26586* (2013.01); *H01J 2237/006* (2013.01); *H01J 2237/20207* (2013.01); *H01J 2237/20278* (2013.01)

(58) Field of Classification Search
CPC .. H01J 37/05; H01J 37/20; H01J 37/08; H01J 37/3171; H01J 2237/006; H01J 2237/20207; H01J 2237/20278; H01L 21/2253; H01L 21/26513; H01L 21/26586
See application file for complete search history.

(56) References Cited

U.S. PATENT DOCUMENTS

2014/0134779 A1* 5/2014 Kadono ............ H01L 21/02631
438/73

\* cited by examiner

*Primary Examiner* — David E Smith
*Assistant Examiner* — Hsien C Tsai
(74) *Attorney, Agent, or Firm* — Nields Lemack & Frame, LLC (57) ABSTRACT

A system and method that allows higher energy implants to be performed, wherein the peak concentration depth is shallower than would otherwise occur is disclosed. The system comprises an ion source, an accelerator, a platen and a platen orientation motor that allows large tilt angles. The system may be capable of performing implants of hydrogen ions at an implant energy of up to 5 MeV. By tilting the workpiece during an implant, the system can be used to perform implants that are typically performed at implant energies that are less than the minimum implant energy allowed by the system. Additionally, the resistivity profile of the workpiece after thermal treatment is similar to that achieved using a lower energy implant. In certain embodiments, the peak concentration depth may be reduced by 3 μm or more using larger tilt angles.

20 Claims, 6 Drawing Sheets

SYSTEM AND TECHNIQUE FOR PROFILE MODULATION USING HIGH TILT ANGLES

FIELD

Embodiments of this disclosure are directed to a system and method for creating a range of high energy implants, and more particularly for implanting field stop layers at different depths.

BACKGROUND

Semiconductor power devices are used in a plurality of applications, including electric vehicles, such as automobiles and locomotives.

One specific type of power device is referred to as an insulated gate bipolar transistor (IGBT). An IGBT combines concepts from bipolar transistors and MOSFETs to achieve an improved power device. The emitter and the gate are disposed on one side of the device, while the collector is disposed on the opposite second side of the device. The emitter is in communication with a heavily p-doped region disposed directly below the emitter. On either side of the heavily p-doped region are heavily n-doped regions, each in communication with the gate. Beneath the heavily p-doped region is a lightly p-doped region. On the opposite side of the device is a second heavily p-doped region, in communication with the collector. Finally, between the second heavily p-doped region and the lightly p-doped region is a lightly n-doped drift layer.

In conventional IGBT devices, the thickness of the lightly n-doped drift layer is determined based on the need to sustain the electrical field while the device is in the off state. As the power ratings for these devices increases, the overall thickness of the device also increases.

One technique to reduce the thickness of these IGBT transistors is to incorporate a heavily n-doped field stop layer between the lightly n-doped drift layer and the second heavily p-doped region. The electrical field decreases rapidly within this field stop layer, allowing thinner devices to be created.

In certain embodiments, this field stop layer is created by implanting ions, such as hydrogen ions, into the lightly n-doped drift layer. This may be done by implanting the ions through the second side of the device. This field stop layer may be disposed adjacent to the second heavily p-doped region. The location of this field stop layer is a function of the thickness of the power device, and therefore may be different for different power devices. For example, many power devices are 100 µm thick. However, higher power devices, such as those for locomotives, may be 550 µm thick.

Designing a single semiconductor processing apparatus that can implant ions at these different depths is very challenging. High power devices may have field stop layers that are much deeper than other power devices. Thus, it would be beneficial if the semiconductor processing apparatus could vary the depth at which it implants these ions, depending on the device thickness.

Unfortunately, semiconductor processing apparatus typically has a limited range of energies that it can be configured to use. The upper limit may be based on design constraints, such as the voltages applied to different components in the apparatus, the electrical isolation between these components, and the available footprint for the apparatus. The lower limit may be dictated based on the choices made to achieve the upper limit. For example, electrodes may be disposed a certain distance apart to ensure electrical isolation when the apparatus operates at its maximum voltage. However, this separation may cause issues if the voltages are significantly reduced, as there may not be a sufficient electrical field to focus and attract the ions.

However, using separate semiconductor processing apparatus for each thickness of power device is not economical. Therefore, it would be beneficial if a single semiconductor processing apparatus could be used over the entire range of energies. Further, it would be beneficial if higher energy implants could be performed that emulate lower energy implants.

SUMMARY

A system and method that allows higher energy implants to be performed, wherein the peak concentration depth is shallower than would otherwise occur is disclosed. The system comprises an ion source, an accelerator, a platen and a platen orientation motor that allows large tilt angles. The system may be capable of performing implants of hydrogen ions at an implant energy of up to 5 MeV or more. By tilting the workpiece during an implant, the system can be used to perform implants that are typically performed at implant energies that are less than the minimum implant energy allowed by the system. Additionally, the resistivity profile of the workpiece after thermal treatment is similar to that achieved using a lower energy implant. In certain embodiments, the peak concentration depth may be reduced by 3 µm or more using larger tilt angles.

According to one embodiment, a semiconductor processing apparatus is disclosed. The apparatus comprises an ion source; a mass analyzer; an accelerator capable of accelerating hydrogen ions to an implant energy between a minimum value and a maximum value, wherein the minimum value is greater than 500 keV; a platen, in communication with a platen orientation motor to vary a tilt angle and a twist angle of the platen; and a controller, wherein the controller configures the accelerator to accelerate the hydrogen ions to an implant energy between the minimum value and the maximum value, and configures the platen orientation motor to a tilt angle and a twist angle such that the hydrogen ions are implanted into a silicon workpiece such that a peak concentration depth (Rp) of hydrogen ions, prior to thermal treatment, is nearly identical to an implant performed at an implant energy of 400 keV. In certain embodiments, the tilt angle is greater than 50°. In some embodiments, the maximum value is 5 MeV and the minimum value is greater than 600 keV. In certain embodiments, the tilt angle is 570. In certain embodiments, the twist angle is 40°. In certain embodiments, the peak concentration depth (Rp), prior to thermal treatment, is at a depth that is between 4.0 µm and 5.0 µm. In some embodiments, the peak concentration depth (Rp), prior to thermal treatment, is at a depth that is between 4.0 µm and 4.5 µm.

According to another embodiment, a semiconductor processing apparatus is disclosed. The apparatus comprises an ion source; a mass analyzer; an accelerator capable of accelerating hydrogen ions to an implant energy between a minimum value and a maximum value; a platen, in communication with a platen orientation motor to vary a tilt angle and a twist angle of the platen; and a controller, wherein the controller configures the accelerator to implant the hydrogen ions at an implant energy between the minimum value and the maximum value, and configures the platen orientation motor to a tilt angle and a twist angle such that the hydrogen ions are implanted into a silicon workpiece such that a peak concentration depth (Rp), prior to thermal treatment, is less than the Rp of a second implant of hydrogen ions at the implant energy performed using a tilt angle of 7°, wherein a difference between the peak concentration depth (Rp) of the implant and the Rp of the second implant is 2.0 µm or more. In certain embodiments, the difference between the Rp of the implant and the Rp of the second implant is 3.0 µm or more. In certain embodiments, the minimum value is greater than 500 keV. In certain embodiments, the minimum value is greater than 600 keV and the maximum value is 5 MeV or more. In certain embodiments, the tilt angle is greater than 50°. In some embodiments, the tilt angle is 57°. In some embodiments, the twist angle is 40°.

According to another embodiment, a method of implanting hydrogen ions into a workpiece is disclosed. The method comprises creating an ion beam of positive hydrogen ions using an ion source; implanting the hydrogen ions into the workpiece at an implant energy of greater than 400 keV; and wherein a tilt angle and a twist angle of the workpiece during the implanting are such that a resistivity of the workpiece, after a thermal treatment, transitions from a minimum value to a maximum value and the transition occurs at a depth of between 3.8 µm and 6.0 µm. In certain embodiments, the minimum value is between 1 and 2 ohm-cm and the maximum value is greater than 300 ohm-cm. In certain embodiments, the implant energy is greater than 500 keV. In some embodiments, the implant energy is greater than 600 keV. In certain embodiments, the tilt angle is greater than 50°. In some embodiments, the method further comprises performing the thermal treatment after the implanting.

BRIEF DESCRIPTION OF THE FIGURES

For a better understanding of the present disclosure, reference is made to the accompanying drawings, which are incorporated herein by reference and in which.

DETAILED DESCRIPTION

A system and method to achieve a variety of implants at different energy levels and depths is disclosed. Specifically, the system and method allow a semiconductor processing apparatus to use higher energies to achieve an implant profile that is similar to that created by a lower energy implant. Thus, the range of implant energies that the semiconductor processing apparatus can achieve is effectively increased.

Figure 1A:
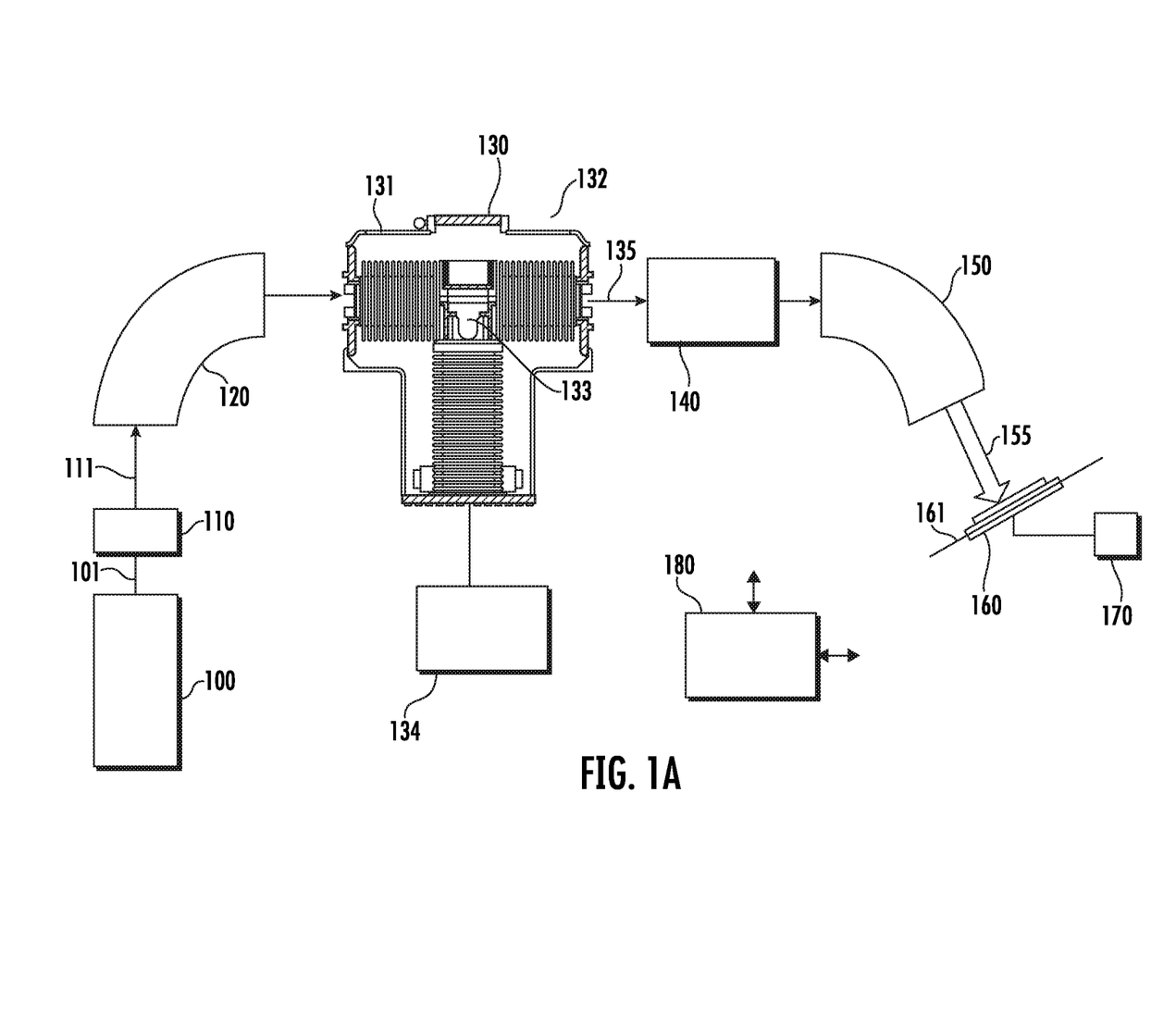
FIG. 1A shows a semiconductor processing apparatus that may be utilized according to one embodiment.

As shown in FIG. 1A, a semiconductor processing apparatus comprises an ion source 100, which is used to generate an ion beam. In one embodiment, a positive ion beam 101 may be created in the traditional manner, such as using a Bernas or indirectly heated cathode (IHC) ion source. Of course, other types of ion sources may also be employed. A feedgas is supplied to the ion source 100, which is then energized to generate ions. In certain embodiments, the feedgas may be hydrogen or helium. Extraction optics are then used to extract these ions from the ion source 100.

The positive ion beam 101 exiting the ion source 100 may be coupled to a Mg charge exchange cell 110, which transforms the positive ion beam 101 into a negative ion beam 111. Of course, other mechanisms for the generation of a negative ion beam are known in the art. The mechanism used to create the negative ion beam is not limited by this disclosure.

The negative ion beam 111 may be directed toward a mass analyzer 120, which only allows the passage of certain species of ions. The negative ions that exit the mass analyzer 120 are directed toward a tandem accelerator 130.

The tandem accelerator has two pathways, which are separated by a stripper tube 133. The input pathway 131 comprises a plurality of input electrodes. These input electrodes may be any suitable electrically conductive material, such as titanium or other metals. The outermost input electrode may be grounded. Each of the subsequent input electrodes may be biased at an increasingly more positive voltage moving closer to the stripper tube 133.

The input pathway 131 leads to the stripper tube 133. The stripper tube 133 is biased positively relative to the outermost input electrode. The stripper tube 133 includes an injection conduit where a stripper gas is injected. The stripper gas may comprise neutral molecules. These neutral molecules may be any suitable species such as, but not limited to argon and nitrogen. The stripper tube 133 has an inlet disposed on the same side as the input pathway 131. The outlet of the stripper tube 133 is in communication with the output pathway 132.

In other words, the stripper tube 133 is positively biased so as to attract the negative ion beam 111 through the input pathway 131. The stripper tube 133 removes electrons from the incoming ions, transforming them from negative ions into positive ions.

The stripper tube 133 is more positive than the electrodes in the output pathway 132. Each subsequent output electrode may be less positively biased moving away from the stripper tube 133. For example, the outermost output electrode may be grounded. Thus, the positive ions in the stripper tube 133 are accelerated through the output pathway 132.

In this way, the ions are accelerated two times. First, negative ions are accelerated through the input pathway 131 to the stripper tube 133. This acceleration is based on the difference between the voltage of the outermost input electrode and the voltage of the stripper tube 133. Next, positive ions are accelerated through the output pathway 132. This acceleration is based on the difference between the voltage of the stripper tube 133 and the voltage of the outermost output electrode in the output pathway 132.

An accelerator power supply 134 may be used to supply the voltages to the stripper tube 133, as well as the electrodes in the input pathway 131 and the output pathway 132. The accelerator power supply 134 may be capable of supply a voltage up to 2.5 MV, although other voltages, either higher or lower, are also possible.

After exiting the tandem accelerator 130, the positive ion beam 135 may enter a filter magnet 140, which allows passage of ions of only a certain charge. In other embodiments, the filter magnet 140 may not be employed. The output of the filter magnet 140 may pass through a scanner 150, which serve to create the final ion beam 155 containing the desired species of ions. The scanner 150 causes the incoming ion beam to be fanned in the width direction so as to form a scanned ribbon ion beam. The output of the scanner is then directed toward a platen 160. A workpiece may be disposed on the platen 160. In certain embodiments, a corrector magnet may be disposed between the scanner 150 and the platen 160.

The platen 160 may be in communication with a platen orientation motor 170. The platen orientation motor 170 is configured to move the platen 160 in any of a plurality of different directions. For example, the platen orientation motor 170 may have the capability to rotate the platen 160. Rotation occurs about an axis that is normal to the surface of the platen 160 and passes through the center of the workpiece (or platen). The angle of rotation may be referred to as the twist angle.

Additionally, the platen orientation motor 170 is configured to tilt the platen 160. Tilt is defined as a rotation about an axis 161 that is parallel to the wider dimension of the ion beam and passing through the center of the platen 160. This tilt is sometimes referred to as X-tilt. The angle of X-tilt may be referred to as the tilt angle.

Additionally, the semiconductor processing apparatus includes a controller 180. The controller 180 may include a processing unit, such as a microcontroller, a personal computer, a special purpose controller, or another suitable processing unit. The controller 180 may also include a non-transitory computer readable storage element, such as a semiconductor memory, a magnetic memory, or another suitable memory. This non-transitory storage element may contain instructions and other data that allows the controller 180 to perform the functions described herein.

The controller 180 may be in communication with the accelerator power supply 134, so as to control the implant energy. In addition, the controller 180 may be in communication with the platen orientation motor 170, so as to adjust the tilt angle and twist angle of the platen 160.

Figure 1B:
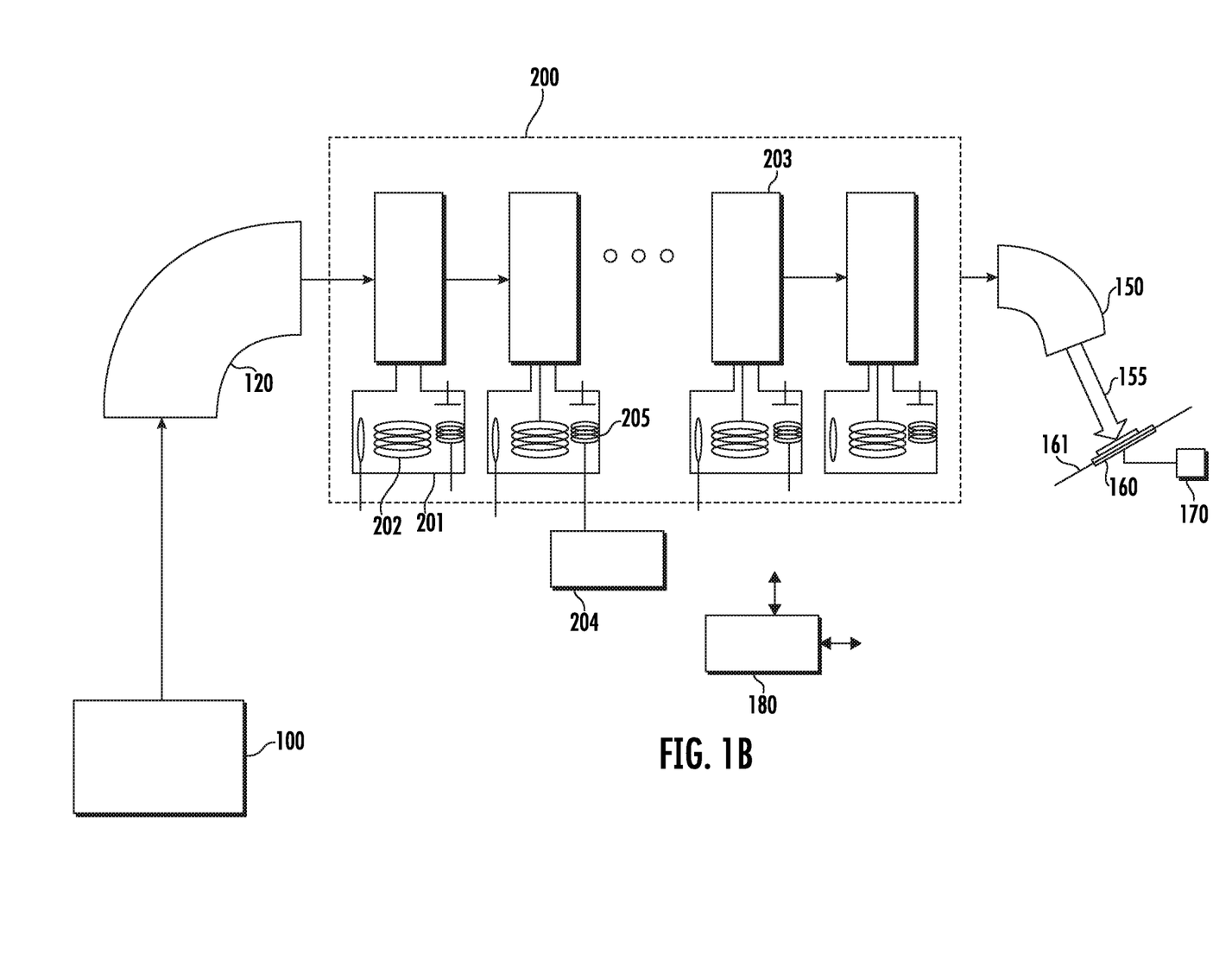
FIG. 1B shows a semiconductor processing apparatus that may be utilized according to a second embodiment.

A second embodiment is shown in FIG. 1B. Components that are common with FIG. 1A are given identical reference designators.

As described above, a semiconductor processing apparatus comprises an ion source 100, which is used to generate an ion beam. The ion source 100 has an aperture through which ions may be extracted from the ion source 100. These ions may be extracted from the ion source 100 by applying a negative voltage to the extraction optics disposed outside the ion source 100, proximate the extraction aperture. The extraction optics may be pulsed so that ions exit at specific times. The group of ions that exits may be referred to as a bunch. In one embodiment, a plurality of bunched ions may be created. The ions may then enter a mass analyzer 120, which may be a magnet that allows ions having a particular mass to charge ratio to pass through. This mass analyzer 120 is used to separate only the desired ions. It is the desired ions that then enter the linear accelerator 200.

The linear accelerator 200 comprises one or more cavities 201. Each cavity 201 comprises a resonator coil 202 that may be energized by electromagnetic fields created by an excitation coil 205. The excitation coil 205 is disposed in the cavity 201 with a respective resonator coil 202. The excitation coil 205 is energized by an excitation voltage, which may be a RF signal. The excitation voltage may be supplied by a respective RF generator 204. In other words, the excitation voltage applied to each excitation coil 205 may be independent of the excitation voltage supplied to any other excitation coil 205. Each excitation voltage is preferably modulated at the resonance frequency of its respective cavity 201.

When an excitation voltage is applied to the excitation coil 205, a voltage is induced on the resonator coil 202. The result is that the resonator coil 202 in each cavity 201 is driven by a sinusoidal voltage. Each resonator coil 202 may be in electrical communication with a respective accelerator electrode 203. The ions pass through apertures in each accelerator electrode 203.

The entry of the bunch into a particular accelerator electrode 203 is timed such that the potential of the accelerator electrode 203 is negative as the bunch approaches, but switches to positive as the bunch passes through the accelerator electrode 203. In this way, the bunch is accelerated as it enters the accelerator electrode 203 and is repelled as it exits. This results in an acceleration of the bunch. This process is repeated for each accelerator electrode 203 in the linear accelerator 200. Each accelerator electrode increases the acceleration of the ions.

After the bunch exits the linear accelerator 200, it is accelerated toward the platen 160 and implanted into the workpiece.

The controller 180 may be in communication with the RF generator 204, so as to control the implant energy. In addition, the controller 180 may be in communication with the platen orientation motor 170, so as to adjust the tilt angle and twist angle of the platen 160.

Of course, the ion implantation system may include other components, such as a scanner 150 to create a ribbon beam, quadrupole elements, additional electrodes to accelerate or decelerate the beam and other elements.

Thus, FIGS. 1A and 1B both show a semiconductor processing apparatus that includes an ion source 100, a mass analyzer 120, an accelerator, a platen 160, a controller 180 and a platen orientation motor 170.

Thus, for each implant, there may be an associated recipe, which includes the voltage applied to the accelerator, and the tilt and twist angles to be supplied by the platen orientation motor 170.

In operation, a workpiece is disposed on the platen 160 and is implanted by the final ion beam 155. The workpiece may be a silicon workpiece. The controller 180 may set the tilt and twist angles to be supplied by the platen orientation motor 170 prior to the implantation. Additionally, the controller 180 may set the voltage to be applied to the accelerator.

According to one embodiment, the semiconductor processing apparatus described above is capable of implanting hydrogen ions with an energy of roughly 5 MeV or more and implanting helium ions with an energy of roughly 7.5 MeV. In certain embodiments, the minimum energy at which the semiconductor processing apparatus described above is capable of implanting hydrogen ions is about 600 keV.

Specifically, in the embodiment of FIG. 1A, the tandem accelerator 130 is designed to allow a maximum voltage difference between the outermost input electrode in the input pathway 131 and the stripper tube 133 to be about 2.5 MV. To vary the implant energy, the voltage applied to the stripper tube 133 and the electrodes within the input pathway 131 and the output pathway 132 may be reduced. However, at lower voltages, the electrical fields in the input pathway 131 and the output pathway 132 are not strong enough to sufficiently attract and focus the ions. Thus, there may be a minimum implant energy that ensures that the tandem accelerator 130 operates properly. This minimum implant energy may be about 600 keV. Additionally, the minimum implant energy may vary based on the geometry of the tandem accelerator and the maximum voltage that may be accommodated.

Regarding the system of FIG. 1B, the RF generator 204 may be configured to apply a voltage to achieve a desired implant energy. Like a tandem accelerator, if the voltage applied by the RF generator 204 is sufficiently small, the electrical fields in the are not strong enough to sufficiently attract and focus the ions. Thus, like the tandem accelerator, the linear accelerator 200 also has a maximum implant energy and a minimum implant energy.

However, many power devices have the field stop layer disposed at a depth that is typically created using an implant of less than 600 keV. For example, the field stop layer may be disposed at a depth that is between 4 and 5 µm. Consequently, the semiconductor processing apparatus described above may be unable to perform implants for these power devices, if used in the conventional manner. Specifically, an implant using an implant energy of 600 keV may create a field stop layer that is disposed at a depth that is greater than 7 µm.

Advantageously, other features of the semiconductor processing apparatus described above make it possible to achieve implants having a concentration depth profile nearly identical to that achieved using a 400 keV implant.

Figure 2:
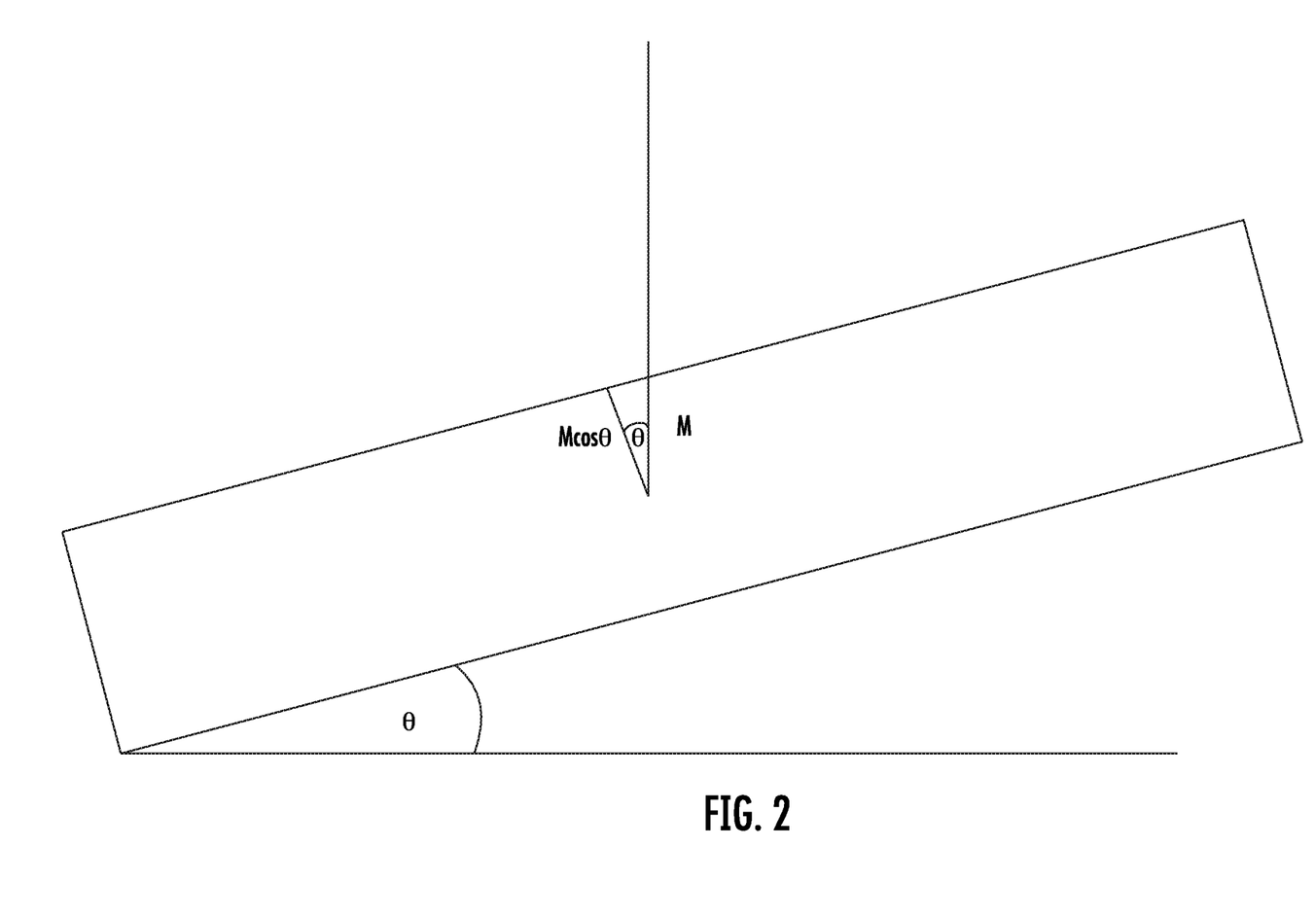
FIG. 2 shows the effect of tilt angle on depth of implantation.

Specifically, the depth to which the ions penetrate the workpiece is affected by the tilt angle. As shown in FIG. 2, ions implanted while the workpiece is at a tilt angle θ, penetrate to a depth of M cos θ, where depth is measured as perpendicular to the surface of the workpiece and where M is defined as the depth that the ions would penetrate if implanted while the tilt angle was set to 0°. In other words, ions implanted using a tilt angle of 45° may achieve a depth that is roughly 70% of that achieved by an implant with a tilt angle of 0°.

Consequently, tilt angle may be used to implant ions to a shallower depth than would occur if the workpiece were positioned perpendicular to the Z direction, or nearly perpendicular to the Z direction.

For example, based on FIG. 2, it would appear that a 400 keV implant may be emulated by using a 600 keV implant where the workpiece is tilted at an angle, θ, where θ is roughly equal to $\cos^{-1}(400/600)$, or roughly 50°.

However, the conversion from a nearly perpendicular implant to a tilted implant is not straightforward. While FIG. 2 shows the trigonometric ratios that may play a part in determining the tilt angle, other factors are used as well. For example, FIG. 2 assumes that implanted ions meet the same resistance to movement within the workpiece regardless of the tilt angle. However, silicon is a crystalline structure, so this assumption may not be accurate. Therefore, more advanced simulation tools may determine that a different tilt angle achieves the same effect as a lower energy perpendicular implant.

Figure 3:
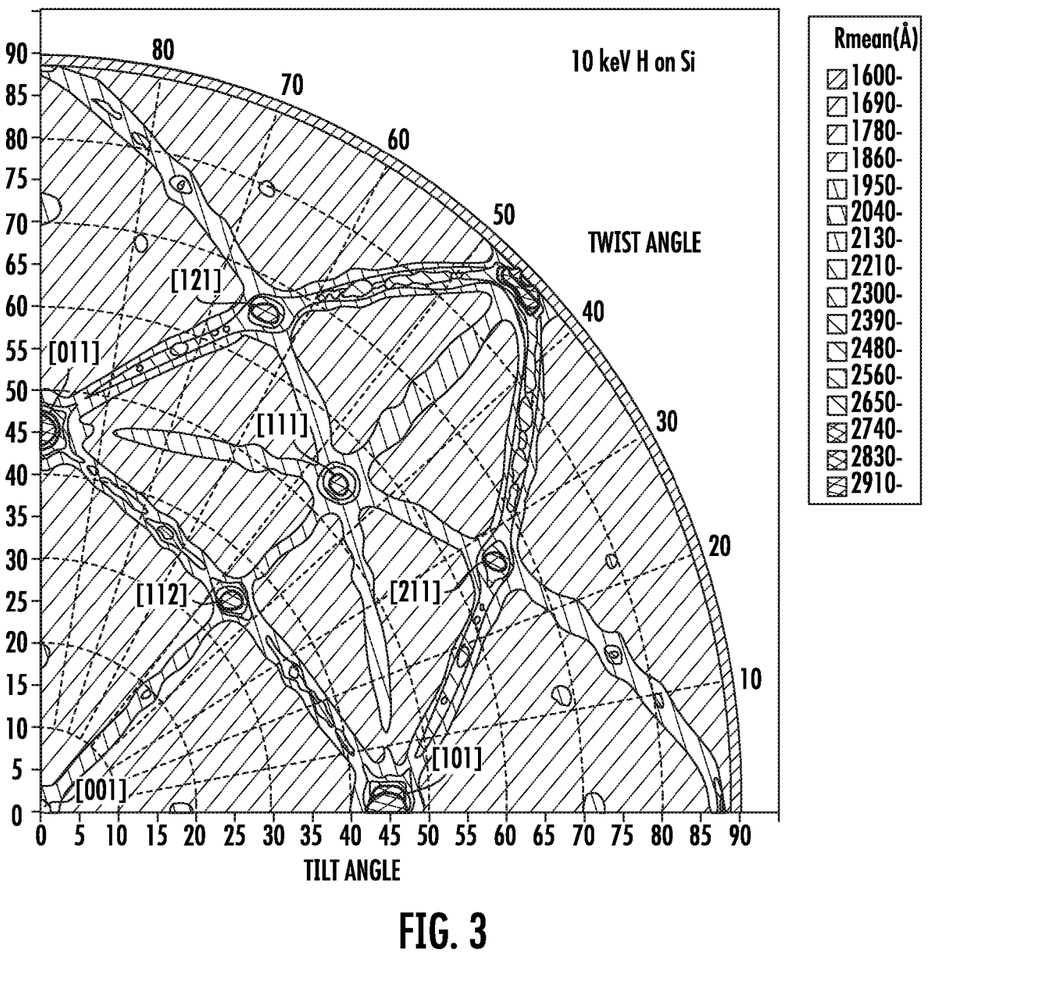
FIG. 3 shows the effects of channels on implant depth.

FIG. 3 shows the effects of channeling on implant depth. In this particular figure, hydrogen was implanted into a silicon workpiece with an energy of 10 keV. The workpiece was then oriented at various tilt and rotation angles and the depth to which the ions penetrate was recorded for each combination. Note that the depth is not only a function of the tilt angle, but also is a function of the twist angle. For example, if the implant aligns with a channel in the silicon crystalline structure, the ions will travel much deeper. This occurs at various combinations of angles, such as tilt angle of 45°, twist angle of 5° (labelled [101]); tilt angle of 65°, twist angle of 25° (labelled [211]); tilt angle of 35°, twist angle of 45° (labelled [112]); tilt angle of 55°, twist angle of 45° (labelled [111]); tilt angle of 45°, twist angle of 85° (labelled [011]); and tilt angle of 65°, twist angle of 75° (labelled [121]). Implants are typically performed at a combination of tilt and twist angles so as to avoid channeling effects.

As noted above, this graph was generated using an implant energy of 10 keV. The exact location and patterns of the channels may vary for higher implant energies.

Thus, the twist angle may be adjusted when changing the tilt angle to ensure that channeling effects are reduced.

In one particular example, to achieve a field stop layer at the desired depth, which may be between 4.0 and 5.0 µm, an implant of hydrogen was performed at a tilt angle of 7° and a twist angle of 22°. This combination may be selected to avoid any channeling effects. The energy of this implant was 400 keV and the dose was 1e14.

Based on the calculations provided above, for a 610 keV implant, a tilt angle that is roughly 50° greater than that used for the 400 keV implant may be employed. However, the tilt angle may be different than this based on the crystalline structure of silicon. Further, the twist angle is adjusted to minimize channeling effects.

Figure 4:
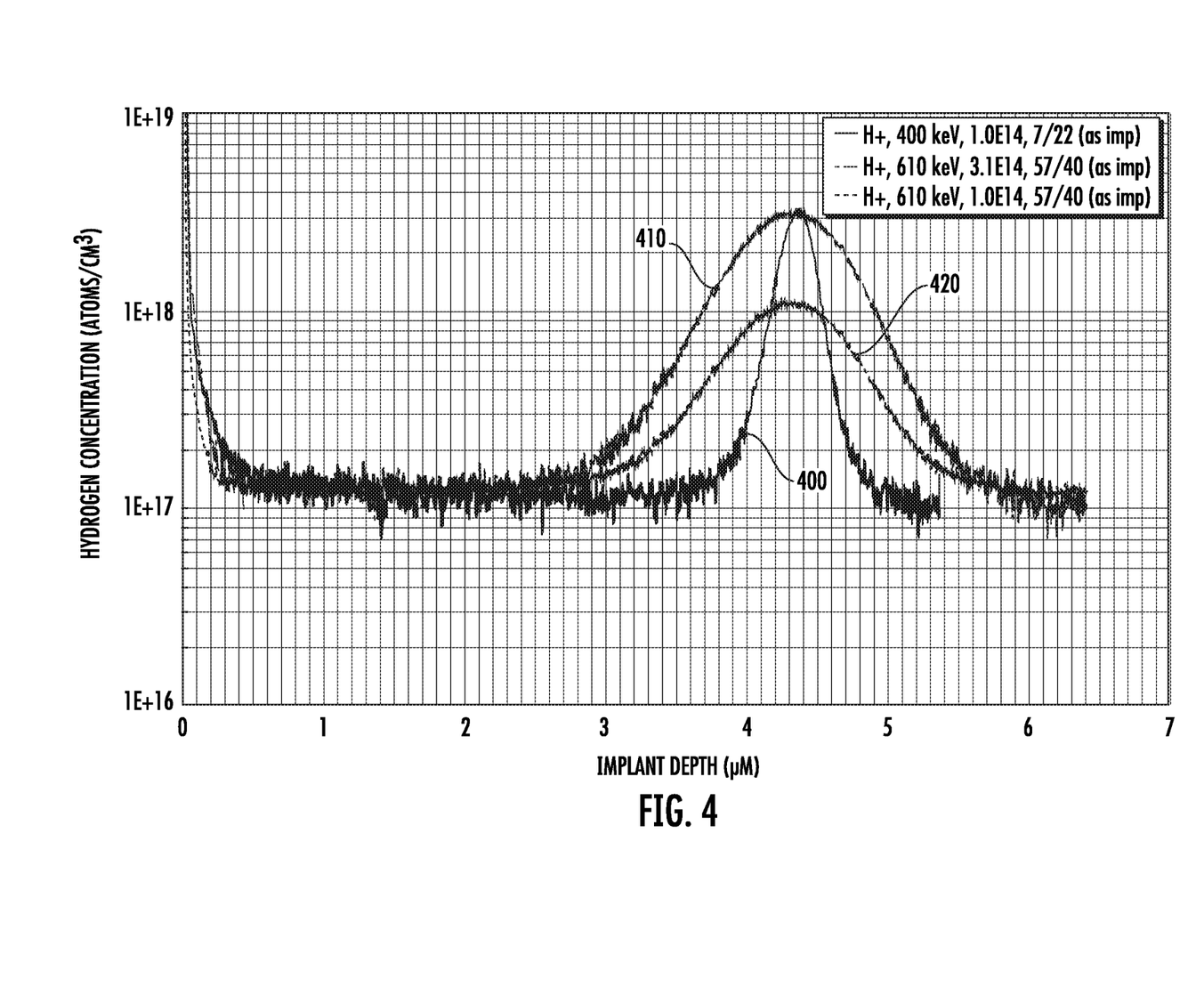
FIG. 4 shows a graph of dopant concentration vs. depth for three different implants.

FIG. 4 shows the dopant concentration as a function of depth for several hydrogen implants. One of these lines represents a lower energy implant, as is traditionally performed. The other two lines represent higher energy implants performed at higher tilt angles, but different doses.

These dopant concentrations are calculated after the implant and prior to any thermal treatment. Line 400 shows the 400 keV implant, performed using a tilt angle of 7°, a twist angle of 22° and a dose of 1e14 cm³. Note that the peak concentration occurs at a depth of about 4.4 µm. This depth of peak concentration is referred to as Rp throughout this disclosure. The peak concentration at this depth is about 3e18 cm³.

Line 410 shows the 610 keV implant, performing using a tilt angle of 57°, a twist angle of 40° and a dose of 3.1e14 cm³. Note that the peak concentration depth (Rp) occurs at a depth of about 4.4 µm. That peak concentration is also about 3e18 cm³. In other words, the peak concentration of line 410 aligns with that of line 400, both in terms of peak concentration and peak concentration depth (Rp).

Line 420 shows a 610 keV implant, also performed using a tilt angle of 57°, a twist angle of 40° and a dose of 1.0e14 cm⁻³. Note that the peak concentration depth (Rp) still occurs at a depth of about 4.4 µm. However, that peak concentration is about 1e18 cm⁻³, since the dose is one third of that used for line 410.

In other words, at a certain dose, the higher energy implant yields nearly identical peak concentration and peak concentration depth (Rp), as measured prior to thermal treatment. In this disclosure, nearly identical denotes that the peak concentration depth (Rp) is within 10% of that of the lower energy implant. In other embodiments, nearly identical denotes that the peak concentration depth (Rp) is within 5% of that of the lower energy implant. Thus, by using large tilt angles, it is possible to perform a higher energy implant where the peak concentration depth (Rp) occurs at a depth of between 4.0 µm and 5.0 µm. In certain embodiments, the peak concentration depth (Rp) occurs at a depth of between 4.0 µm and 4.5 µm. In certain embodiments, the peak concentration depth (Rp) occurs at a depth of between 4.2 µm and 4.5 µm. The higher energy implant is defined as one using an implant energy greater than 400 keV. In certain embodiments, the higher energy implant is defined as one using an implant energy greater than 500 keV. In certain embodiments, the higher energy implant is defined as one using an implant energy greater than 600 keV.

Thus, the controller is able to configure the accelerator to accelerate the hydrogen ions to an implant energy between a minimum value and a maximum value, and configure the platen orientation motor to a tilt angle and a twist angle such that the hydrogen ions are implanted into a silicon workpiece such that a peak concentration depth (Rp) of hydrogen ions, prior to thermal treatment, is nearly identical to an implant performed at an implant energy of 400 keV.

Note that this is only one example. Similar results may be obtained for different tilt and twist angles. For example, various combinations of twist angles and tilt angles greater than 50° may be used to achieve similar results.

Thus, for the semiconductor processing apparatus shown in FIGS. 1A and 1B, it is now possible to perform hydrogen implants that create field stop layers as shallow as 4 µm, wherein the controller 180 uses the minimum allowable energy for the accelerator and a large tilt angle. Using the same semiconductor processing apparatus, it is also possible to perform hydrogen implants that create field stop layers as deep as 50 µm or more, wherein the controller 180 uses the maximum allowable energy for the accelerator and a smaller tilt angle. These different depths are achieved by varying the power applied to the accelerator and changing the tilt and twist angles.

Figure 5:
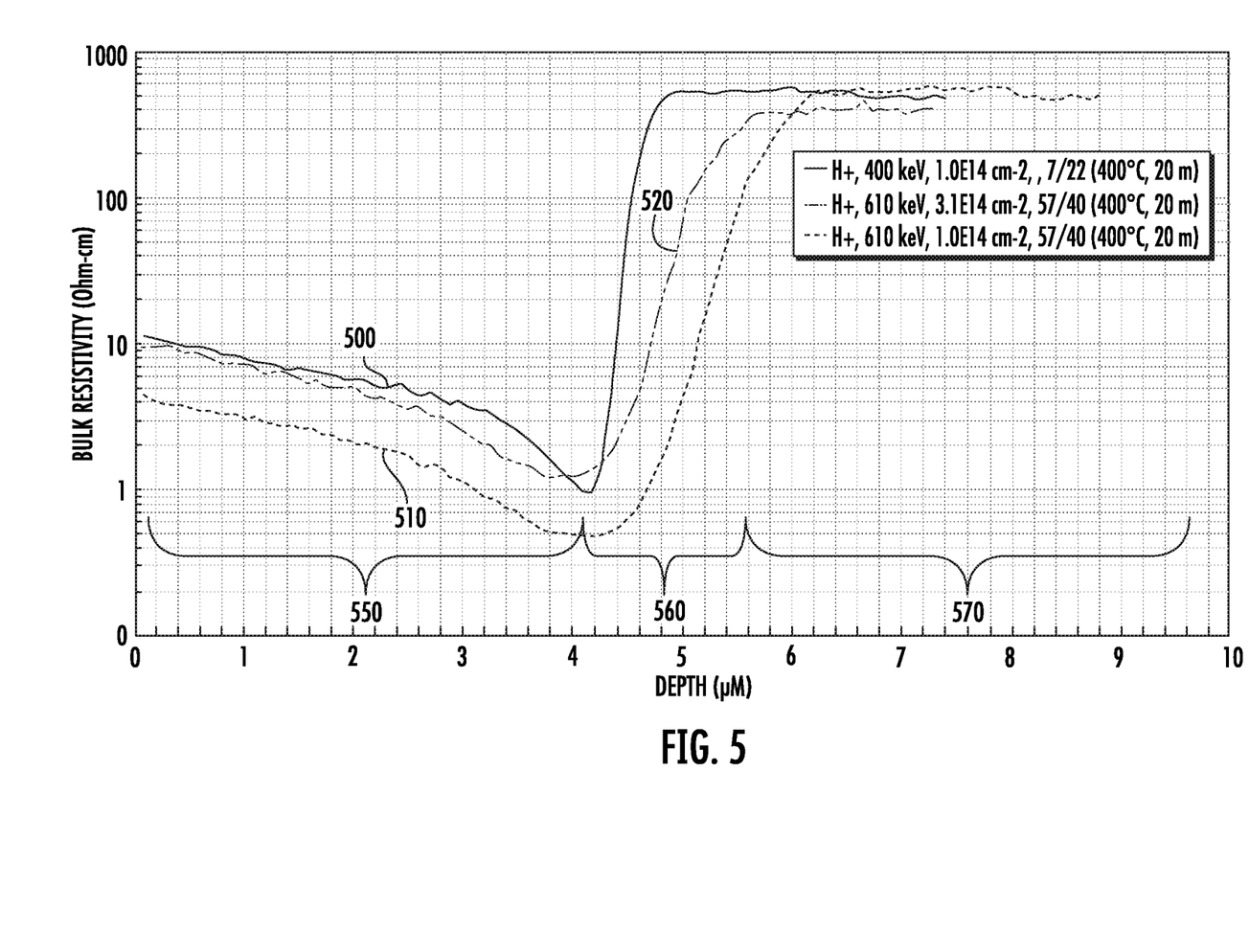
FIG. 5 shows a graph of dopant concentration vs. depth after thermal treatment for the three different implants of FIG. 4.

After thermal treatment to activate the dopant, the dopant profile may change somewhat. FIG. 5 shows a graph of resistivity vs. depth for the implants of FIG. 4, after the workpiece has been annealed for 20 minutes at 400° C. after the implant. Resistivity refers to the bulk resistivity of the silicon workpiece, measured in units of ohm-cm.

Note that after the thermal treatment, the dopant, which in this case is hydrogen, diffuses toward the surface of the workpiece. Consequently, for all three lines, there is a low resistivity region 550, which extends from the surface to a depth that is roughly equal to the location of the peak concentration depth (Rp) (see FIG. 4). Moving away from the surface, note that there is a gradual decrease in resistivity due to the diffusion of dopant toward the surface. There is also a transition region 560 between about 4.0 µm and 5.5 µm where the resistivity increases sharply. Additionally, at greater depths, the resistivity is quite large, as this is the undoped region 570.

Line 500 represents a 400 keV implant, performed using a tilt angle of 7°, twist angle of 22°, and dose of 1.0e14. Line 500 shows a gradual decrease in resistivity from the surface, where the resistivity is about 10 ohm-cm, to a depth of about 4.2 µm. There is then a sharp transition in resistivity starting at about 4.2 µm, where the resistivity changes from 1 ohm-cm to about 600 ohm-cm within about 0.6 µm. In other words, the transition region for line 500 extends from about 4.2 µm to 4.8 µm.

Line 510 represents a 610 keV implant, performed using a tilt angle of 57°, twist angle of 40°, and dose of 3.1e14. Line 510 shows a gradual decrease in resistivity from the surface, where the resistivity is about 4.5 ohm-cm, to a depth of about 4.0 µm. There is then a less abrupt transition in resistivity at about 4.1 µm, where the resistivity changes from about 0.35 ohm-cm to about 600 ohm-cm within about 2.0 µm. In other words, the transition region for line 510 extends from about 4.0 µm to 6.2 µm.

Thus, although the lines 400 and 410, prior to thermal treatment, appear similar, with nearly identical peak concentration depth (Rp) and peak concentration, the lines differ after thermal treatment. This may be caused by the fact that the higher energy implant (line 410) was performed using a dose that was three times greater than the dose used for the lower energy implant (line 400). Thus, one approach may be to retain the calculated tilt and twist angles, but reduce the dose to be similar, such as within about 20%, to that used for the low energy implant.

Line 420 of FIG. 4 shows this configuration. Note that the peak concentration, prior to thermal treatment, is lower than that of line 400. However, as shown in FIG. 5, after the thermal treatment, this difference is reduced. Line 520 represents a 610 keV implant, performed using a tilt angle of 57°, twist angle of 40°, and dose of 1.0e14. Line 520 shows a gradual decrease in resistivity from the surface, where the resistivity is about 10 ohm-cm, to a depth of between about 3.8 µm and 4.0 µm. There is then a less abrupt transition in resistivity at about 4.0 µm, where the resistivity changes from about 1 ohm-cm to about 400 ohm-cm within 1.5 µm. In other words, the transition region for line 520 extends from about 3.8 µm to 5.5 µm. Thus, line 520 transitions from a minimum value to a maximum value and the transition occurs at a depth of between 3.8 µm and 6.0 µm, wherein the minimum value is between 1 and 2 ohm-cm and the maximum value is greater than 300 ohm-cm, such as between 300 and 500 ohm-cm.

The resistivity profile after thermal treatment is very similar for the line 500 and line 520. Note, as stated above, that the upward transition of line 500 begins at 4.2 µm, while line 520 begins the upward transition at between about 3.8 µm and 4.0 µm. Thus, difference in depth at the start of the transition region 560 of these two lines about 0.4 µm. Thus, in certain embodiments, the difference in this metric is less than 0.25 µm. In other embodiments, the difference in this metric is less than 0.5 µm.

Further, note that the resistivity at the start of this transition region is between 0.9 and 1.0 ohm-cm for line 500. The resistivity at the start of the transition region is between 1.0 and 1.5 ohm-cm for line 520. Thus, the difference in resistivity between these two lines at the start of the transition region 560 is less than 1 ohm-cm. In certain embodiments, the difference is less than 0.5 ohm-cm.

Further, note that the line 500 reaches its maximum resistivity at about 4.9 µm, and the maximum resistivity is between 500 and 600 ohm-cm. Also note that line 520 reaches its maximum resistivity at about 5.6 µm and the maximum resistivity is roughly 400 ohm-cm. In other words, the depths that each implant reaches its maximum resistivity are within about 0.7 µm of each other. In other embodiments, the depths are within 1.0 µm of each other.

Additionally, note that line 500 reaches a resistivity of 100 ohm-cm at a depth of about 4.5 µm, while line 520 reaches this resistivity at a depth of about 5.1 µm. In other words, the depths that each implant reaches a resistivity of 100 ohm-cm are within about 0.6 µm of each other. In other embodiments, these depths are within 1.0 µm of each other.

Note that while FIGS. 4 and 5 show the higher energy implant occurring at a tilt angle of 57°, other angles may also be employed. As described above, based on the trigonometric ratios, the tilt angle may be a value greater than 50°. Twist angles may be calculated based on the selected tilt angle.

The system and method described herein have many advantages. In one test, it was determined that a 610 keV implant, performed with a tilt angle of 7° and a twist angle of 22°, creates a concentration profile where the peak concentration depth (Rp) of hydrogen ions occurs at about 7.7 µm. In contrast, FIG. 4 shows that the high tilt implant achieved a peak concentration depth (Rp) of 4.4 µm. Thus, a decrease in the peak concentration depth (Rp) of more than 3 µm was achieved. Thus, in certain embodiments, by using a tilt angle by 50° or more, it is possible to reduce the peak concentration depth (Rp) by 3 µm or more, as compared to an implant done at a tilt angle of 7°. In other embodiments, the peak concentration depth (Rp) is reduced by 2 µm or more by varying the tilt angle. In this way, a semiconductor processing apparatus, having an accelerator with a minimum implant energy that greater than 400 keV can achieve an implant in which the Rp is nearly identical to that achieved by an apparatus that uses an implant energy of 400 keV. In some embodiments, the minimum implant energy is greater than 500 keV. In certain embodiments, the minimum implant energy is greater than 600 keV. In this way, the effective range of implant depths for a high power semiconductor processing apparatus can be extended below the perceived minimum implant energy through the use of high tilt angles. In other words, an apparatus with a minimum implant energy of 600 keV can achieve a concentration profile similar to that achieved by a lower power apparatus at 400 keV.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A semiconductor processing apparatus, comprising:
   an ion source;
   a mass analyzer;
   an accelerator capable of accelerating hydrogen ions to an implant energy between a minimum value and a maximum value, wherein the minimum value is greater than 500 keV;
   a platen, in communication with a platen orientation motor to vary a tilt angle and a twist angle of the platen; and
   a controller, wherein the controller configures the accelerator to accelerate the hydrogen ions to an implant energy between the minimum value and the maximum value, and configures the platen orientation motor to a tilt angle and a twist angle such that the hydrogen ions are implanted into a silicon workpiece such that a peak concentration depth (Rp) of hydrogen ions, prior to thermal treatment, is nearly identical to an implant performed at an implant energy of 400 keV.

2. The semiconductor processing apparatus of claim 1, wherein the tilt angle is greater than 50°.

3. The semiconductor processing apparatus of claim 1, wherein the maximum value is 5 MeV and the minimum value is greater than 600 keV.

4. The semiconductor processing apparatus of claim 3, wherein the tilt angle is 57°.

5. The semiconductor processing apparatus of claim 4, wherein the twist angle is 40°.

6. The semiconductor processing apparatus of claim 1, wherein the peak concentration depth (Rp), prior to thermal treatment, is at a depth that is between 4.0 µm and 5.0 µm.

7. The semiconductor processing apparatus of claim 1, wherein the peak concentration depth (Rp), prior to thermal treatment, is at a depth that is between 4.0 µm and 4.5 µm.

8. A semiconductor processing apparatus, comprising:
   an ion source;
   a mass analyzer;
   an accelerator capable of accelerating hydrogen ions to an implant energy between a minimum value and a maximum value;
   a platen, in communication with a platen orientation motor to vary a tilt angle and a twist angle of the platen; and
   a controller, wherein the controller configures the accelerator to implant the hydrogen ions at an implant energy between the minimum value and the maximum value, and configures the platen orientation motor to a tilt angle and a twist angle such that the hydrogen ions are implanted into a silicon workpiece such that a peak concentration depth (Rp), prior to thermal treatment, is less than the Rp of a second implant of hydrogen ions at the implant energy performed using a tilt angle of 7°, wherein a difference between the peak concentration depth (Rp) of the implant and the Rp of the second implant is 2.0 µm or more.

9. The semiconductor processing apparatus of claim 8, wherein the difference between the Rp of the implant and the Rp of the second implant is 3.0 µm or more.

10. The semiconductor processing apparatus of claim 8, wherein the minimum value is greater than 500 keV.

11. The semiconductor processing apparatus of claim 10, wherein the minimum value is greater than 600 keV and the maximum value is 5 MeV or more.

12. The semiconductor processing apparatus of claim 8, wherein the tilt angle is greater than 50°.

13. The semiconductor processing apparatus of claim 8, wherein the tilt angle is 57°.

14. The semiconductor processing apparatus of claim 13, wherein the twist angle is 40°.

15. A method of implanting hydrogen ions into a workpiece comprising:
   creating an ion beam of positive hydrogen ions using an ion source;
   implanting the hydrogen ions into the workpiece at an implant energy of greater than 400 keV; and
   wherein a tilt angle and a twist angle of the workpiece during the implanting are such that a resistivity of the workpiece, after a thermal treatment, transitions from a minimum value to a maximum value and the transition occurs at a depth of between 3.8 µm and 6.0 µm.

16. The method of claim 15, wherein the minimum value is between 1 and 2 ohm-cm and the maximum value is greater than 300 ohm-cm.

17. The method of claim 15, wherein the implant energy is greater than 500 keV.

18. The method of claim 17, wherein the implant energy is greater than 600 keV.

19. The method of claim 15, wherein the tilt angle is greater than 50°.

20. The method of claim 15, further comprising performing the thermal treatment after the implanting.

* * * * *